United States Patent
Wang

(10) Patent No.: US 6,337,795 B1
(45) Date of Patent: Jan. 8, 2002

(54) HOUSING FOR A POWER STRUCTURE

(76) Inventor: Joseph Wang, No. 40, Ta-Hua 1st Rd., Chi-Tu Dist., Chilung City (TW)

(*) Notice: Subject to any disclaimer, the term of this patent is extended or adjusted under 35 U.S.C. 154(b) by 0 days.

(21) Appl. No.: 09/571,514

(22) Filed: May 15, 2000

(51) Int. Cl.[7] .................................................. H05K 7/20
(52) U.S. Cl. ...................................... 361/695; 454/184
(58) Field of Search .......................... 307/150; 361/683, 361/686, 687–688, 694–697; 454/184

(56) References Cited

U.S. PATENT DOCUMENTS

| | | | | |
|---|---|---|---|---|
| 4,972,296 A | * | 11/1990 | Chu | ............................ 361/610 |
| 5,172,305 A | * | 12/1992 | Dewilde | ...................... 361/695 |
| 6,040,981 A | * | 3/2000 | Schmitt et al. | ............. 361/695 |
| 6,074,296 A | * | 6/2000 | Wu | ............................. 454/184 |

* cited by examiner

*Primary Examiner*—Gregory Thompson
(74) *Attorney, Agent, or Firm*—Bacon & Thomas, PLLC

(57) ABSTRACT

An improved housing for a power supply. A lateral seat plate is inserted into a supporting structure of the housing. The lateral seat place includes an inserting surface and a supporting surface. Two lateral sides at the lower edge of the supporting surface are installed with buckling grooves adapted to be buckled by the buckles of the supporting structure. One outer lateral side of the two buckling grooves is extended with a top braking portion. The two top braking portions are engaged with two buckles.

7 Claims, 4 Drawing Sheets

HOUSING FOR A POWER STRUCTURE

BACKGROUND OF THE INVENTION

1. Field of the Invention

The present invention relates to a supporting structure of a power supply, wherein a lateral seat plate is inserted into the supporting structure for being locked with a heat dissipating fan. If the heat dissipating fan is faulty, the lateral seat plate can be removed to permit easy replacement of the fan unit so that the power supply can operate normally.

2. Description of the Related Art

Currently, if the supporting structure of a conventional power supply is faulty or does not operate normally, then the overall power supply must be detached to update the supporting structure. Moreover, prior art power supply units only have one display lamp. The display lamp only serves to display the normality of the power supply, but can not determine whether the heat dissipating fan is faulty. Therefore, such display lamps are often burnt out because the power supply can not dissipate heat normally. Often after the computer shuts down, it is discovered that the heat dissipating fan was faulty for a long period of time. Although the supporting structure of a power supply has been commercially sold, in which a supporting structure is placed in a housing, and a heat dissipating plate is located in the lateral seat plate for heat dissipation, if the fan is faulty and must be updated, the entire machine set must be detached. Moreover, the prior art power supply only has one display lamp for indicating the proper operation of the power supply, while it can not be used to determine whether the heat dissipating fan is faulty. Thus, it is also inconvenient.

SUMMARY OF THE INVENTION

Accordingly, the primary object of the present invention is to provide a supporting structure for a power supply, whereby the heat dissipating fan of the power supply can be maintained and located easily so that the power supply is operated normally.

Another object of the present invention is to provide an improved supporting structure. A lateral seat plate is inserted into the supporting structure to be locked with a heat dissipating fan. In the inventive structure, if the heat dissipating fan is faulty so as not to be operated normally, the lateral seat plate can be easily extracted out for easy replacement of the fan unit so that the power supply may work normally.

A further object of the present invention is to provide a supporting structure for a power supply, in which a set of displaying lamps are further installed on the supporting structure, so that a user may know whether the heat dissipating fan is operated normally.

The various objects and advantages of the present invention will be more readily understood from the following detailed description when read in conjunction with the appended drawing.

DETAILED DESCRIPTION OF THE PREFERRED EMBODIMENTS

Figure 1:
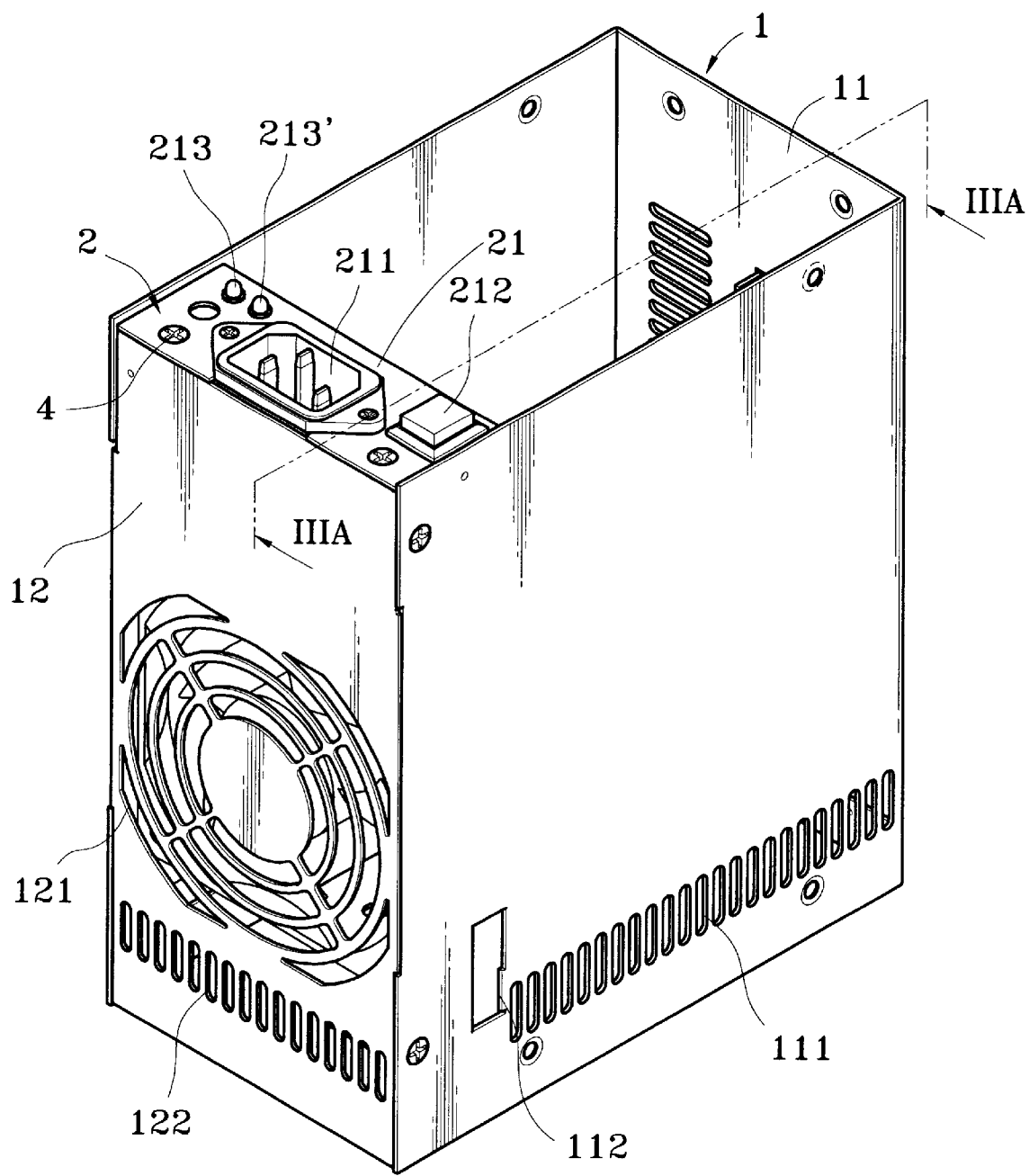
FIG. 1 is a schematic perspective view of the present invention.
Figure 2:
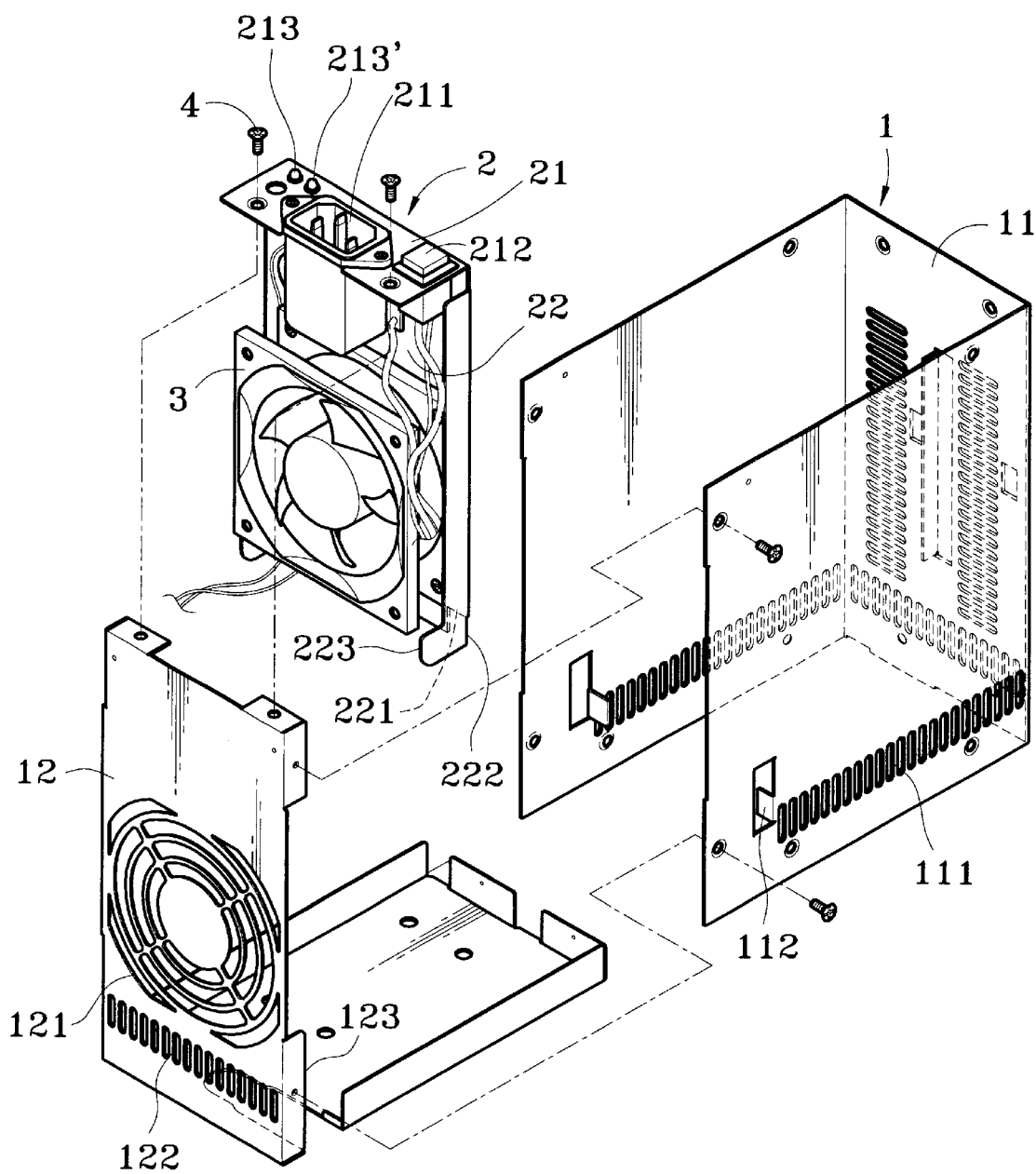
FIG. 2 is an exploded perspective view of the present invention.

With reference to FIGS. 1 and 2, the schematic perspective view and exploded schematic view of the present invention are illustrated herein. The present invention includes a supporting structure 1 and a lateral seat plate 2 inserted in the supporting structure 1.

A fixing frame 11 and a second frame 12 are firmly secured, via fixing screws 4, to be formed as a supporting structure 1 with a receiving space. Further, at the lower edges of two lateral sides of the first frame 11 are punched with respective buckles 112 that bend into the receiving space. Each surface of the first frame 11 is properly installed with heat dissipating holes 111. One lateral surface of the second frame 12 is installed with a fan opening 121 and a plurality of heat dissipating hole 122. The lateral seat plate 2 is formed with an inserting surface 21 and a supporting surface 22. The inserting surface 21 is firmly secured with a receptacle 211, a switch key 212 and two display lamps 213 and 213'. The two display lamps 213 and 213' are used to display the operation state (normal or fault) of the fan 3 and a power supply (not shown). The two lateral sides at the lower edge of the supporting surface 22 are each installed with a buckling groove 221 that is buckled by a respective one of the buckles 112 of the supporting structure 1. One outer lateral side of the two buckling grooves 221 is extended with a top braking portion 222. The top braking portion 222 has another end being formed as a guide arcuate portion 223. The heat dissipating fan 3 is positioned on the supporting surface.

The supporting structure 1 is integrally formed and has a receiving space.

Figure 3A:
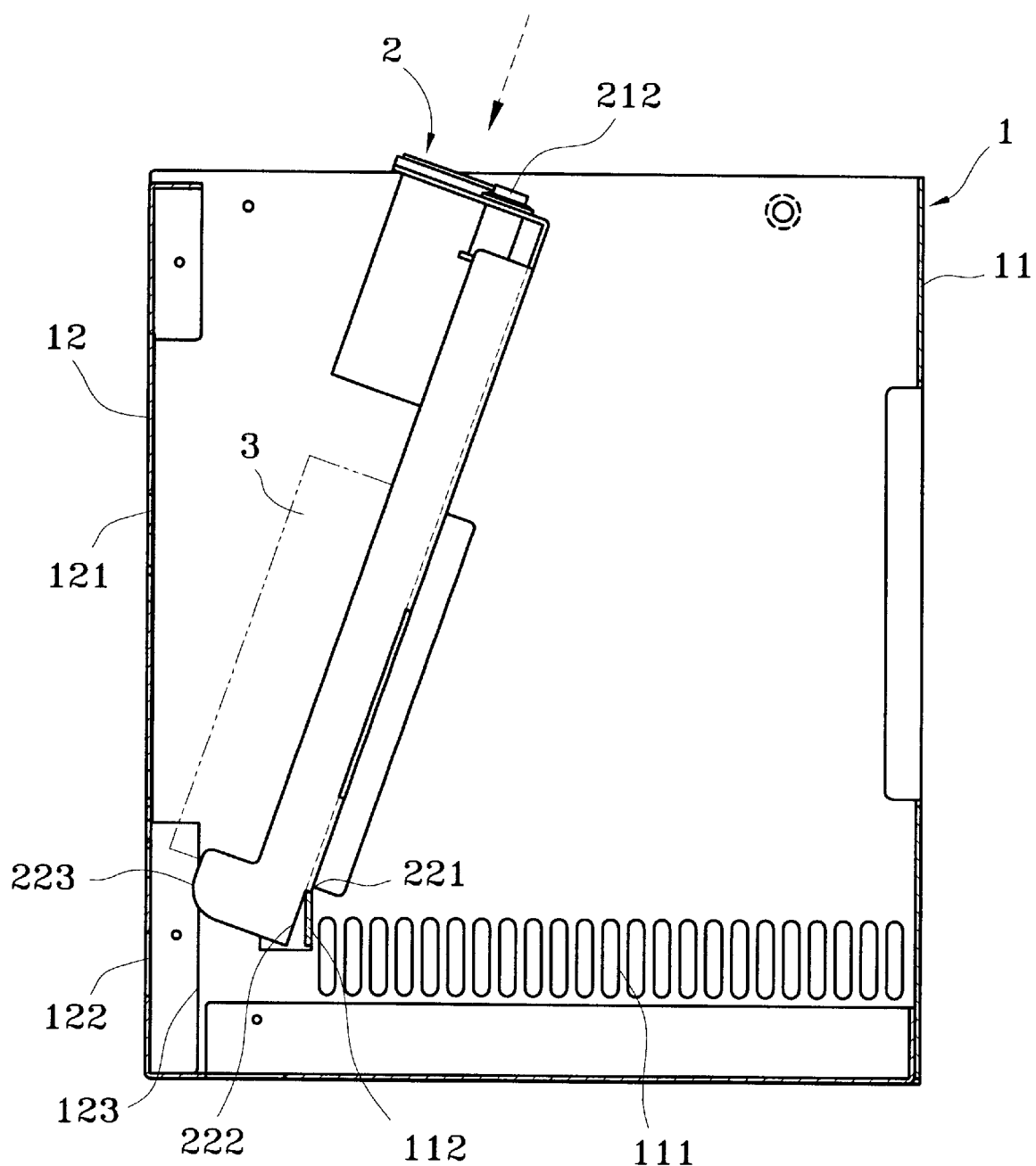
FIG. 3A is a schematic view, partially in section, showing the positioning operation in the present invention.
Figure 3B:
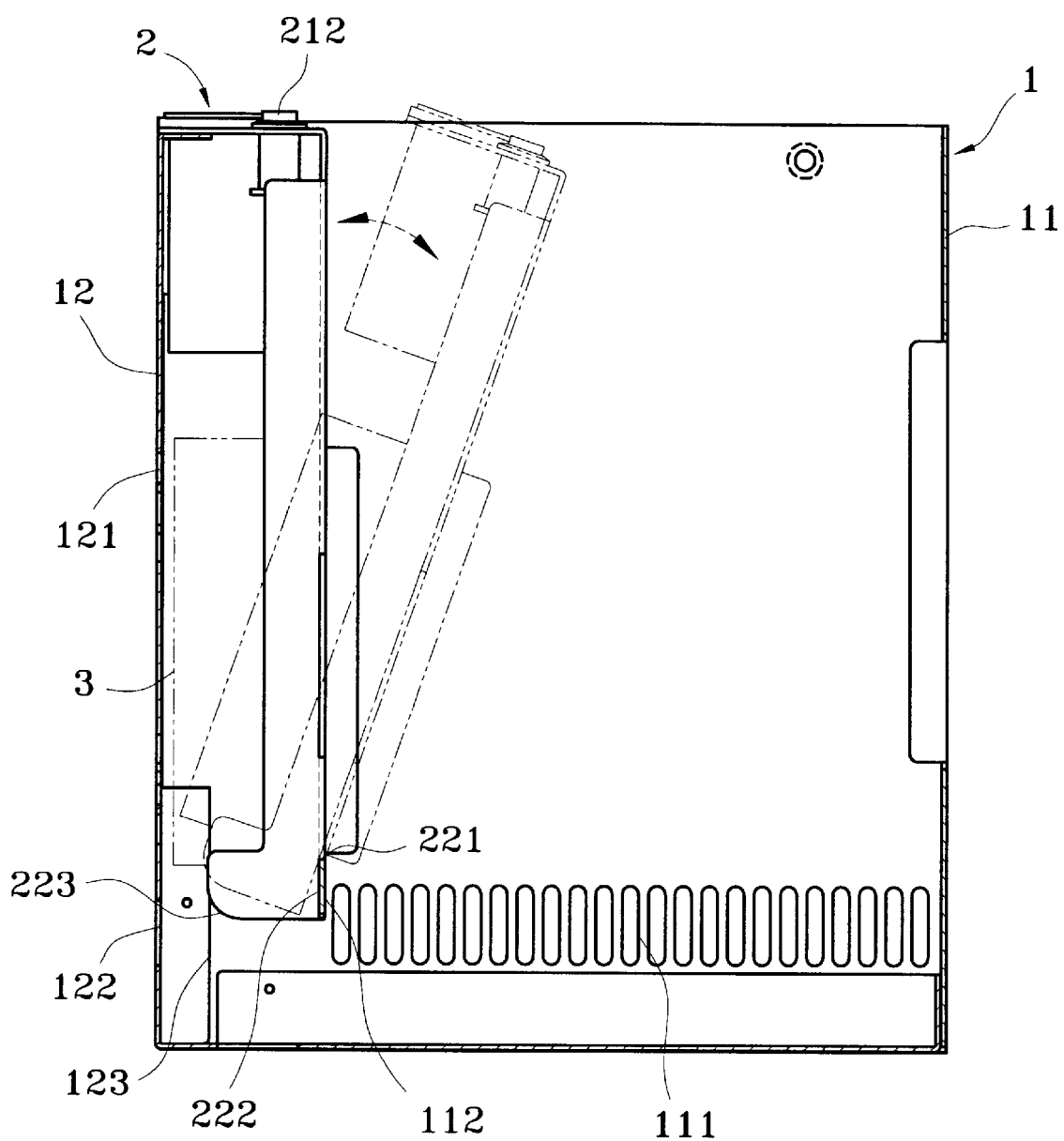
FIG. 3B is another schematic view, partially in section, showing the positioning operation in the present invention.

With reference to FIGS. 3A and 3B, an operation schematic cross sectional view and a continuous operation schematic view along line IIIA—IIIA of FIG. 1 are illustrated. As shown in the figures, the lateral seat plate 2 is obliquely inserted into the supporting structure 1. As the buckling groove 221 of the lateral seat plate 2 presses against the buckle 112 of the supporting structure 1, via the end surfaces of the guide arctuate portion 223 and the bending piecel 23 of the second frame 12, the lateral seat plate 2 is straightened so that the top braking portion 222 of the lateral seat plate 2 presses on one side of the buckle 112. Then, the inserting surface 21 of the lateral seat plate 2 is combined with the second frame 12 of the supporting structure 1. Finally, the lateral seat plate 2 is secured to the supporting structure 1 by fixing screws 4. Thus, the heat dissipating fan 3 is aligned with the fan opening 121 of the supporting structure 1. If it is necessary for the lateral seat plate 2 to be removed, the screws 4 are unscrewed, and the lateral seat plate 2 tilted so that the lateral seat plate 2 can be drawn out.

The present invention provides a supporting structure of a power supply. Thus, the user can easily replace a faulty heat dissipation fan with a new fan.

The supporting structure for a power supply according to the present invention is an improvement over the prior art. Moreover, by the present invention, a heat dissipating fan can be maintained, and positioned easily and conveniently.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A housing structure for a power supply, the housing structure comprising:

a support structure having two lateral sides;

a receiving space formed between the two lateral sides;

lower edges of each of the lateral sides of the supporting structure comprising a buckle that is bent towards the receiving space;

a lateral seat plate with an inserting surface and a supporting surface, the supporting surface including two lateral sides at a lower edge thereof;

each of the lateral sides of the supporting surface comprising a buckling groove that is buckled by a respective one of the buckles of the supporting structure;

an outer lateral side of each of the buckling grooves being extended to form a top braking portion; and the top braking portions of the buckling grooves engaged by a respective one of the buckles.

2. The housing structure for a power supply as claimed in claim 1, wherein the supporting structure comprises a first frame and a second frame that are combined to form the receiving space.

3. The housing structure for a power supply as claimed in claim 1, wherein an end surface of the top braking portions comprises a round guide portion adapted to be inserted into the supporting structure.

4. The housing structure for a power supply as claimed in claim 1, further comprising two display lamps that are installed at the inserting surface of the lateral seat plate and adapted to display operative conditions of a heat dissipating fan and the power supply.

5. The housing structure for a power supply as claimed in claim 1, wherein a heat dissipating fan is installed at the supporting surface of the lateral seat plate.

6. The housing structure for a power supply as claimed in claim 1, wherein all surfaces of the supporting structure are installed with respective fan openings and heat dissipating holes.

7. The housing structure for a power supply as claimed in claim 1, wherein the supporting structure is integrally formed.

* * * * *